United States Patent
Oyer (10) Patent No.: US 10,854,781 B2
(45) Date of Patent: Dec. 1, 2020

(54) PARABOLIC VERTICAL HYBRID LIGHT EMITTING DIODE

(71) Applicant: Facebook Technologies, LLC, Menlo Park, CA (US)

(72) Inventor: Celine Claire Oyer, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/705,194

(22) Filed: Dec. 5, 2019

(65) Prior Publication Data

US 2020/0127162 A1 Apr. 23, 2020

Related U.S. Application Data

(63) Continuation of application No. 15/880,372, filed on Jan. 25, 2018, now Pat. No. 10,535,800.

(60) Provisional application No. 62/542,672, filed on Aug. 8, 2017.

(51) Int. Cl.
| | |
|---|---|
| *H01L 33/10* | (2010.01) |
| *H01L 33/06* | (2010.01) |
| *H01L 33/30* | (2010.01) |
| *H01L 33/00* | (2010.01) |
| *H01L 33/44* | (2010.01) |
| *H01L 33/40* | (2010.01) |
| *H01L 33/14* | (2010.01) |
| *H01L 33/24* | (2010.01) |
| *H01L 33/32* | (2010.01) |

(52) U.S. Cl.
CPC .......... *H01L 33/105* (2013.01); *H01L 33/007* (2013.01); *H01L 33/0066* (2013.01); *H01L 33/0093* (2020.05); *H01L 33/06* (2013.01); *H01L 33/145* (2013.01); *H01L 33/24* (2013.01); *H01L 33/30* (2013.01); *H01L 33/32* (2013.01); *H01L 33/405* (2013.01); *H01L 33/44* (2013.01); *H01L 2933/0016* (2013.01)

(58) Field of Classification Search
CPC ............... H01L 33/105; H01L 33/0066; H01L 33/0093; H01L 33/007; H01L 33/0079; H01L 33/06; H01L 33/145; H01L 33/24; H01L 33/30; H01L 33/32; H01L 33/405; H01L 33/44; H01L 2933/0016
USPC .......................................................... 257/13
See application file for complete search history.

(56) References Cited

U.S. PATENT DOCUMENTS

| | | | |
|---|---|---|---|
| 9,653,642 B1 | 5/2017 | Raring et al. | |
| 2005/0276299 A1* | 12/2005 | Kondo ................ | H01S 5/18388 372/50.23 |

(Continued)

*Primary Examiner* — Tong-Ho Kim
(74) *Attorney, Agent, or Firm* — Fenwick & West LLP (57) ABSTRACT

A micro-light emitting diode (LED) includes an epitaxial structure having a mesa and a top portion on the mesa. The epitaxial structure further includes quantum wells within the mesa configured to emit light, claddings surrounding the quantum wells, and a light emitting surface on a side opposite the mesa and top portion. A reflective contact is on the top portion of the epitaxial structure. Light emitted from the quantum wells are transmitted through the mesa and the top portion in first directions, and reflected by the reflective contact back through the top portion and the mesa in second directions toward the light emitting surface. The top portion allows the quantum wells to be positioned at a parabola focal point of the mesa without limiting cladding thickness.

19 Claims, 6 Drawing Sheets

(56) References Cited

U.S. PATENT DOCUMENTS

| | | | |
|---|---|---|---|
| 2006/0113638 A1* | 6/2006 | Maaskant | H01L 33/20 257/623 |
| 2006/0186420 A1* | 8/2006 | Hirukawa | B82Y 20/00 257/82 |
| 2012/0114004 A1* | 5/2012 | Satoh | B82Y 20/00 372/50.1 |
| 2013/0175556 A1* | 7/2013 | Ray | H01L 33/56 257/88 |
| 2014/0050244 A1* | 2/2014 | Ohno | H01L 33/20 372/46.01 |

* cited by examiner

PARABOLIC VERTICAL HYBRID LIGHT EMITTING DIODE

CROSS REFERENCE TO RELATED APPLICATION

This application is a continuation of co-pending U.S. application Ser. No. 15/880,372, filed Jan. 25, 2018, which claims the benefit of U.S. Provisional Application No. 62/542,672, filed Aug. 8, 2017, each of which is incorporated by reference in its entirety.

BACKGROUND

Light emitting diodes (LEDs) can be used as individual pixel elements in electronic displays. To improve the pixel density of displays, it is desirable to decrease the size of the LEDs and to improve their electrical and optical performance. For example, the light extraction efficiency of a LED can be improved using structures that reflect and collimate light generated within the LED. However, effective collimation of the light can constrain the types and sizes of structures in the LED, resulting in performance tradeoffs.

SUMMARY

Embodiments relate to a light emitting diode (LED) including an epitaxial structure and a reflective contact on the epitaxial structure. The epitaxial structure includes a mesa having a truncated top at a first side of the epitaxial structure, one or more quantum wells within the mesa to emit light, a top portion on the truncated top of the mesa, and a light emitting surface at a second side of the epitaxial structure opposite the first side. At least a portion of the light emitted from the one or more quantum wells are transmitted through the mesa and the top portion in first directions, and reflected by the reflective contact back through the top portion and the mesa in second directions toward the light emitting surface.

In some embodiments, the mesa includes a parabolic shape and the one or more quantum wells are positioned at a parabolic focal point of the mesa. A top portion of the mesa includes a cylindrical structure.

Some embodiments include a method of manufacturing a LED. The method includes: forming an epitaxial structure including one or more quantum wells; forming a contact on the epitaxial structure; depositing photosensitive material on the contact; and etching the epitaxial structure with the contact and the photosensitive material as masks to form a mesa having a truncated top and a top portion over the truncated top.

In some embodiments, etching the epitaxial structure causes the mesa to have a parabolic shape and the one or more quantum wells to be positioned at a parabola focal point of the mesa.

In some embodiments, etching the epitaxial structure includes performing a first etch using the photosensitive material as a first mask to form the mesa; and performing a second etch using the contact as a second mask to form the top portion on the mesa.

In some embodiments, the method further includes applying a reflow process to the photosensitive material to form a shape. The shape is transferred to the mesa by the etching of the epitaxial structure with the photosensitive material as a mask.

DETAILED DESCRIPTION

Embodiments relate to a LED including a mesa having a truncated top and a top portion on the truncated top of the mesa, and the manufacturing of the LED. The top portion is an elongated region of the epitaxial structure extending from the truncated top of the mesa. The epitaxial structure includes a top cladding, quantum wells that emit light, and bottom cladding. A reflective contact is on the top portion to reflect light emitted from the quantum wells and transmitted through the mesa and the top portion in first directions, and reflected by the reflective contact back through the top portion and the mesa in second directions toward a light emitting surface. The top portion allows the quantum wells to be positioned at a focal point of the (e.g., parabolic) mesa without limiting the thickness epitaxial layers, such as the top cladding.

The micro-LED, or "μLED" as described herein, refers to a particular type of light emitting diode having a small active light emitting area, such as between 0.2 to 100 um in diameter or width.

Overview of Example μLED

Figure 1:
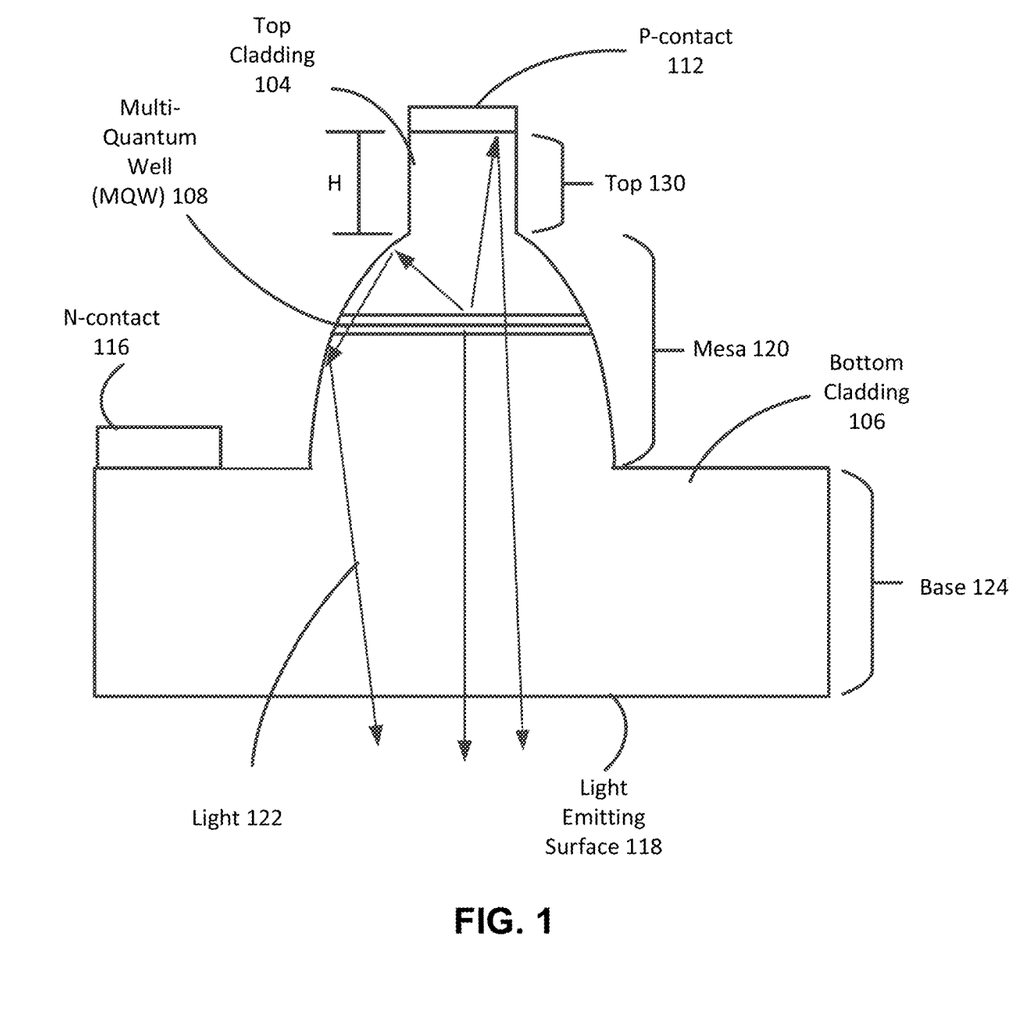
FIG. 1 is a cross-sectional diagram of a micro-LED (μLED), in accordance with one embodiment.

FIG. 1 is a schematic diagram of a cross section of a micro-LED 100 (hereinafter referred to as "μLED"), in accordance with one embodiment. The μLED 100 may include, among other components, an epitaxial structure including a top cladding 104, a bottom cladding 106, and a multi-quantum well ("MQW") 108 between the top cladding 104 and the bottom cladding 106. In some embodiments, the μLED 100 may include a single quantum. The μLED 100 further includes a p-contact 112 on the top portion 130 of the epitaxial structure 320, and an n-contact 116 on the bottom cladding 104. The semiconductor structure is shaped, such as via an etch process, into a mesa 120, a base 124 of the mesa 120, and a top portion 130 on the mesa 120. The top cladding 104 defines the top of the mesa 120 and the top portion 130, and the bottom cladding 106 defines a bottom portion of the mesa 120 and the base 124. The top cladding 104 may be a p-type cladding and the bottom cladding 106 may be an n-type cladding. In some embodiments, the top cladding 104 is an n-type cladding and the bottom cladding 106 is a p-type cladding. Here, the p-contact 112 is an n-contact and the n-contact 116 is a p-contact.

The multi-quantum well 108 defines an active light emitting area that is included in the structure of the mesa 120. The mesa 120 may include a truncated top defined on a side opposed to a light emitting surface 118 of the μLED 100. In some embodiments, the epitaxial structure including the top cladding 104, MQW 108, and bottom cladding 106 are grown on a growth substrate.

The mesa 120 may include various shapes, such as a parabolic shape with a truncated top, to form a reflective enclosure for light 122 generated within the μLED 100. In other embodiments, the mesa 120 may include a cylindrical shape with a truncated top, or a conic shape with a truncated top, or some other light-collimating shape. The top portion 130 is formed on the truncated top of the mesa 120 to improve the extraction efficiency of light for the μLED 100, and to enhance electrical performance. The top portion 130 has a cylindrical shape. In some embodiments, the top portion 130 may be some other elongated shape that extends from the truncated top of the mesa 120. For example, the top portion 130 may be cube shaped, or some other shape.

The arrows show how the light 122 emitted from the MQW 108 is reflected off the p-contact 112 and internal walls of the mesa 120 and top portion 130 toward the light emitting surface 118 at an angle sufficient for the light to escape the μLED device 100 (i.e., within a critical angle of total internal reflection). The p-contact 112 and the n-contact 116 electrically connect the μLED 100, such as to a display substrate including a control circuit for the μLED 100. The n-contact 116 is formed at the base 124, which is defined by a surface of the bottom cladding 106 opposite the light emitting surface 118. The n-contact 116 may include a conductive material to support the placement of the μLED 100 on the display substrate with the p-contact 112 and the n-contact 116 bonded to the display substrate.

The μLED 100 may include an active light emitting area defined by the MQW 108. The μLED 100 directionalizes the light output from the MQW 108 and increases the brightness level of the light output. In particular, the p-contact 112 may be reflective for the light 122 emitted from the MQW 108. The mesa 120, top portion 130, and p-contact 112 cause reflection of the light 122 from the MQW 108 to form a collimated or quasi-collimated light beam emerging from the light emitting surface 118.

The mesa 120 and top portion 130 may be formed by etching into a semiconductor structure, including the top cladding 104, the MQW 108, and the bottom cladding 106, during wafer processing steps. The etching results in the MQW 108 being in the structure of the mesa 120, and at a particular distance to the p-contact 112 to facilitate the collimation of the light 122. For example, the MQW 108 may be located at the parabola focal point of the mesa 120. A portion of the generated light 122 is reflected at the mesa 120 and top portion 130 to form the quasi-collimated light beam emitted from the light emitting surface 118.

One or many advantages of the top portion 130 being formed in the top cladding 104 is that a thicker top cladding 104 may be used. In some embodiments, the top cladding 104 may have a height of 10 um (or more), and the top portion 130 may have a height H of between 0.1 and 5 um. Without the top portion 130 and having only a mesa, the top cladding 104 must be thinner in order for the MQW 108 to be at a parabola focal point with respect to the mesa structure. Thus, the top portion 130 provides for thicker top cladding 104 while keeping the MQW 108 at the parabola focal point of the mesa 120. A thin top cladding 104 is challenging to produce and presents poor electrical performance, and also can reduce Internal Quantum Efficiency (IQE). With the parabolic mesa 120 and cylindrical top portion 130, the top cladding 104 can be as thick as needed to achieve desirable electrical properties. Furthermore, the thickness of an electron blocking layer (EBL) in the top cladding 104 can be increased to improve the optical performance.

Furthermore, the top portion 130 allows for size reduction of LEDs. With the truncated parabolic mesa shape without the cylindrical top portion 130, LED size diminution is limited by the thickness requirements of the top cladding 104. For example, if the top cladding 104 is too thick (e.g., 100 nm), having the MQW 108 at the focal point while being able to process the p-contact 112 may not be possible. With the parabolic mesa shape and cylindrical top portion 130, the thickness of the top cladding 104 can be varied.

Furthermore, different types of epitaxial layers and structures may be used with the top portion 130. Red color light, for example, has longer wavelengths than blue or green color light, and thus a larger top cladding 104 including top portion 130 may be used for LEDs that emit red color light in order to keep the MQW 108 at the parabola focal point. In some embodiments, a red color LED epitaxial structure may include a top cladding 104 including P—GaAs, and having a top portion 130 with a height H of 0.1 to 5 um. In another example, a red LED epitaxial structure may include a top cladding 104 including P—GaP, and having top portion 130 with a height H of 3 to 5 um.

In some embodiments, the mesa 120 has a height between 0.2 to 10 um, the MQW 108 has a height between a few nanometers to 10 um, the top cladding 104 has a height between 0.1 to 0.5 um, and the bottom cladding 106 has a height between 0 um (e.g., if the growth substrate is transparent and conductive) and more than 20 um.

Example Process of Manufacturing μLED

Figure 2:
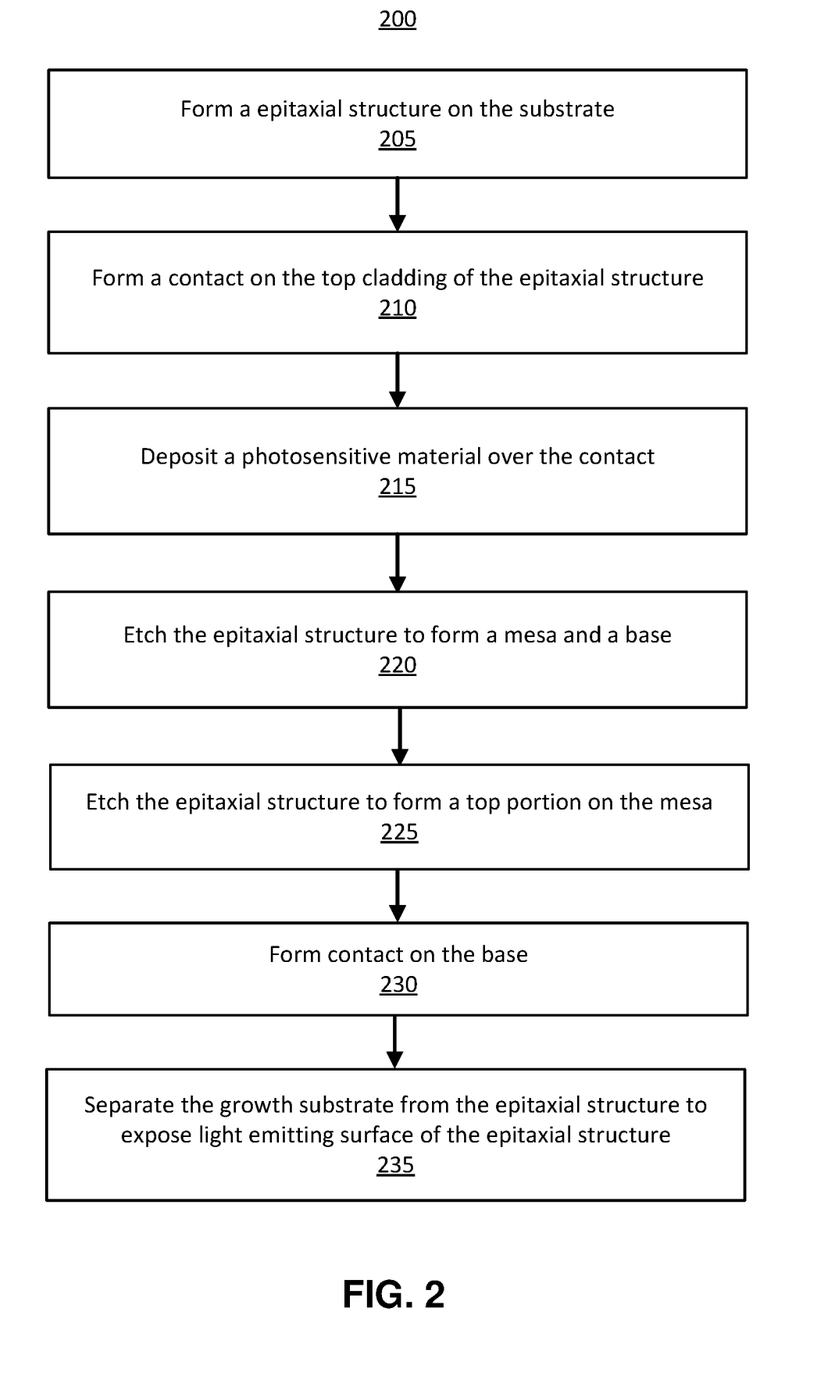
FIG. 2 is flowchart of a process for manufacturing a μLED, in accordance with one embodiment.

FIG. 2 is a flowchart of a process 200 for manufacturing a μLED, in accordance with one embodiment. The process 200 may be performed to manufacture a μLED 100 having a top portion 130 over a mesa 120. The process 200 is discussed with reference to FIGS. 3A through 3D which show manufacturing of the μLED 100, in accordance with one embodiment. In some embodiments, the process 200 may include different and/or additional steps, or some steps may be in different orders.

Figure 3A:
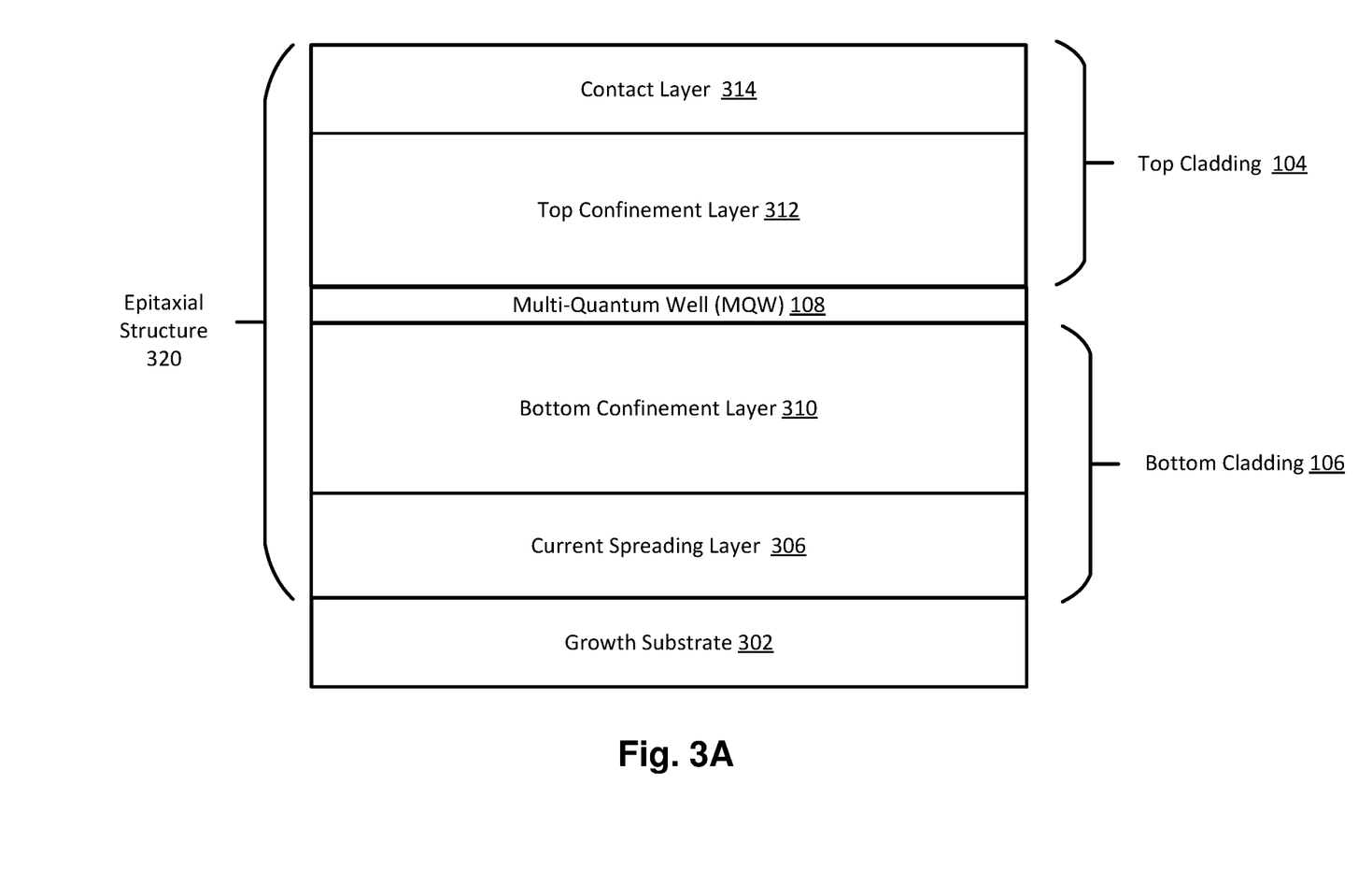
FIGS. 3A through 3D show an epitaxial structure and a μLED manufactured from the epitaxial structure, in accordance with one embodiment.

An epitaxial structure of a LED, such as the μLED 100, is formed 205 on a growth substrate. FIG. 3A shows a cross section of an epitaxial structure 320 and a growth substrate 302, in accordance with one embodiment. The epitaxial structure 320 is etched to form the mesa 120 and top portion 130 of the μLED 100.

The epitaxial structure 320 may include semiconductor layers grown on the growth substrate 302. The semiconductor layers include the bottom cladding 106 on the growth substrate 302, the MQW 108 on the bottom cladding 106, and the top cladding 104. The epitaxial structure 320 may be grown using techniques such as Molecular Beam Epitaxy (MBE) or Metalorganic Chemical Vapor Deposition (MOCVD).

The growth substrate 302 may include a variety of suitable materials for forming an epitaxial layers. The type of growth substrate and epitaxial structure 320 may vary based on the type of LED (e.g., emission color). For example, the top cladding 104 and bottom cladding 106 may be GaN-based heterostructure or a GaAs-based heterostructure. A GaAs-based heterostructure may be grown on a GaAs substrate, a AlInGaP (red LED) may be grown on a GaP substrate, and a GaN-based heterostructure may be grown on a GaAs, GaP, sapphire, Si, or GaN substrate, or some other type of substrate. The top cladding 104 includes the p-type layers of the epitaxial structure 320. The top cladding 104 may include, among other things, a top confinement layer 312 facing the MQW 108, and a contact layer 314 on the top confinement layer 312. The MQW 108 may include a multiple quantum wells, or in some embodiments, a single quantum well is used instead of multiple quantum wells. The bottom cladding 106 includes the n-type layers of the epitaxial structure 320. The bottom cladding 106 may include a current spreading layer 306 on the growth substrate 302, and a bottom confinement layer 310. The confinement layers 310 and 312 provide electron blocking layers including a barrier material to confine electrons in the MQW 108. As discussed above, the top portion 130 of the LED 100 provides for variable heights for the top cladding 104 while keeping the MQW 108 in the parabola focal point of the mesa 120, which allows for a thicker top confinement layer 312. The contact layer provides an interface to the p-contact 112 for the epitaxial structure 320.

Additional details regarding formation of a semiconductor structure (or "material structure") that may be applicable to some embodiments are discussed in U.S. Patent Application Publication No. 2006/0110839, filed Feb. 2, 2004, which is incorporated by reference in its entirety.

Figure 3B:
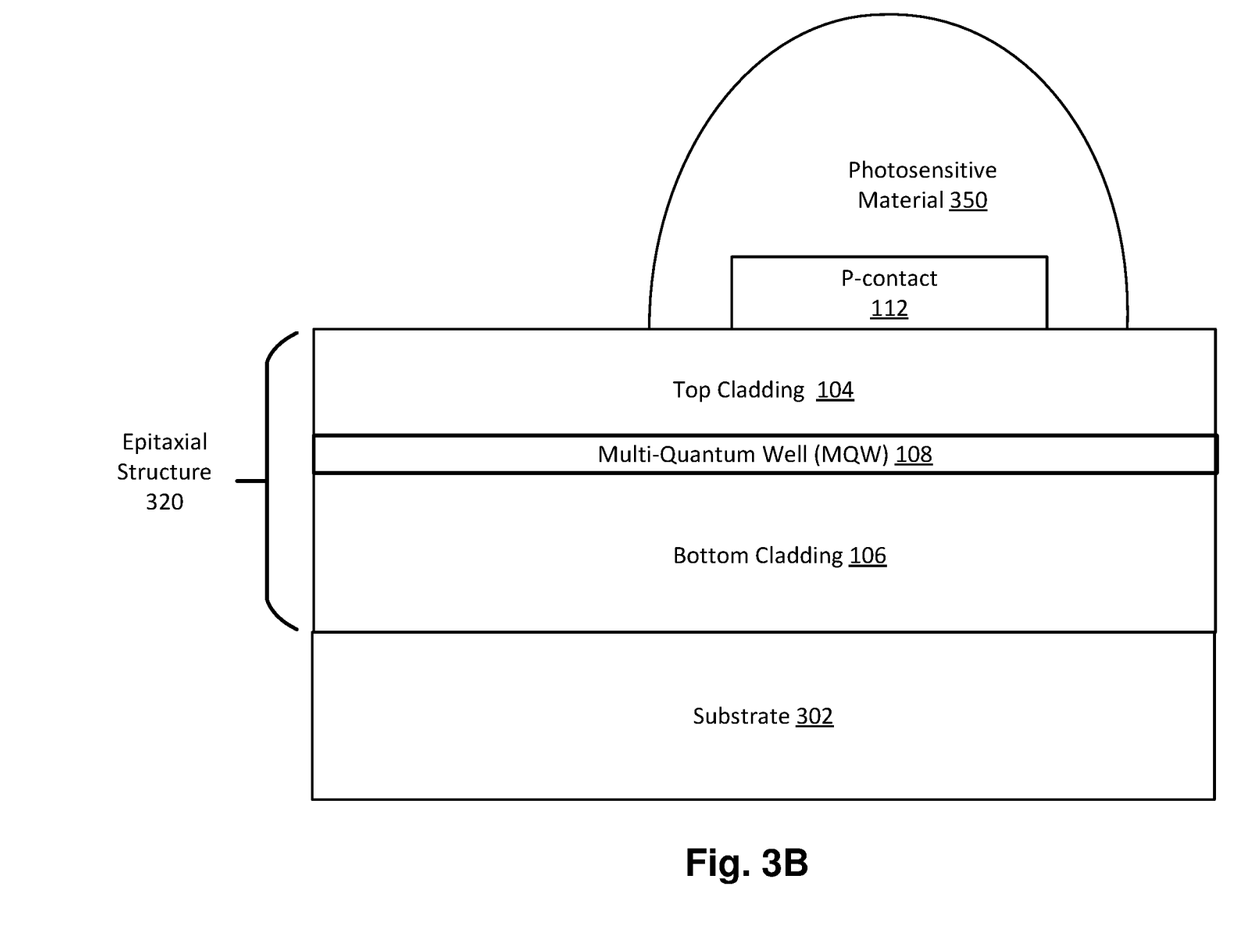

A contact (e.g., p-contact 112) is formed 210 on the top cladding 104 of the epitaxial structure 320. With reference to FIG. 3B, the p-contact 112 may be a metallic material deposited on the top cladding 104 to define the location of the mesa 120 and top portion 130. In some embodiments, a dielectric layer may be formed on top cladding 104, and the p-contact 112 is formed on the dielectric layer, with a portion of the p-contact 112 extending through the dielectric layer to contact the top cladding 104. As discussed in greater detail below, the p-contact 112 provides a hard mask for etching the epitaxial structure 320 to form the top portion 130. Furthermore, the contact may be a reflective contact that reflects light emitted from the MQW 108.

A photosensitive material is deposited 215 over the contact. With reference to FIG. 3B, the photosensitive material 350 is formed over the p-contact 112. The photosensitive material 350 may cover the p-contact 112. The photosensitive material 350 provides a photoresist mask for etching the epitaxial structure 320 to from the mesa 120. The surface of the top cladding 104 is patterned using the photosensitive material 350 to define a region of the epitaxial structure 320 to be formed into the mesa 120. The photosensitive material 350 may be a negative photoresist or a positive photoresist.

In some embodiments, a reflow process is applied to the photosensitive material 350. The reflow process includes applying a thermal treatment to the photosensitive material 350 and results in the photosensitive material 350 having a parabolic, lens, or ellipse shape. The type of shape may vary, and complicated shapes (e.g., half donut) may be formed using reflow. As discussed in greater detail below, the shape of the reflown photosensitive material 350 may be transferred to the epitaxial structure 320 to form the mesa 120 via etching with a controlled selectivity.

Figure 3C:
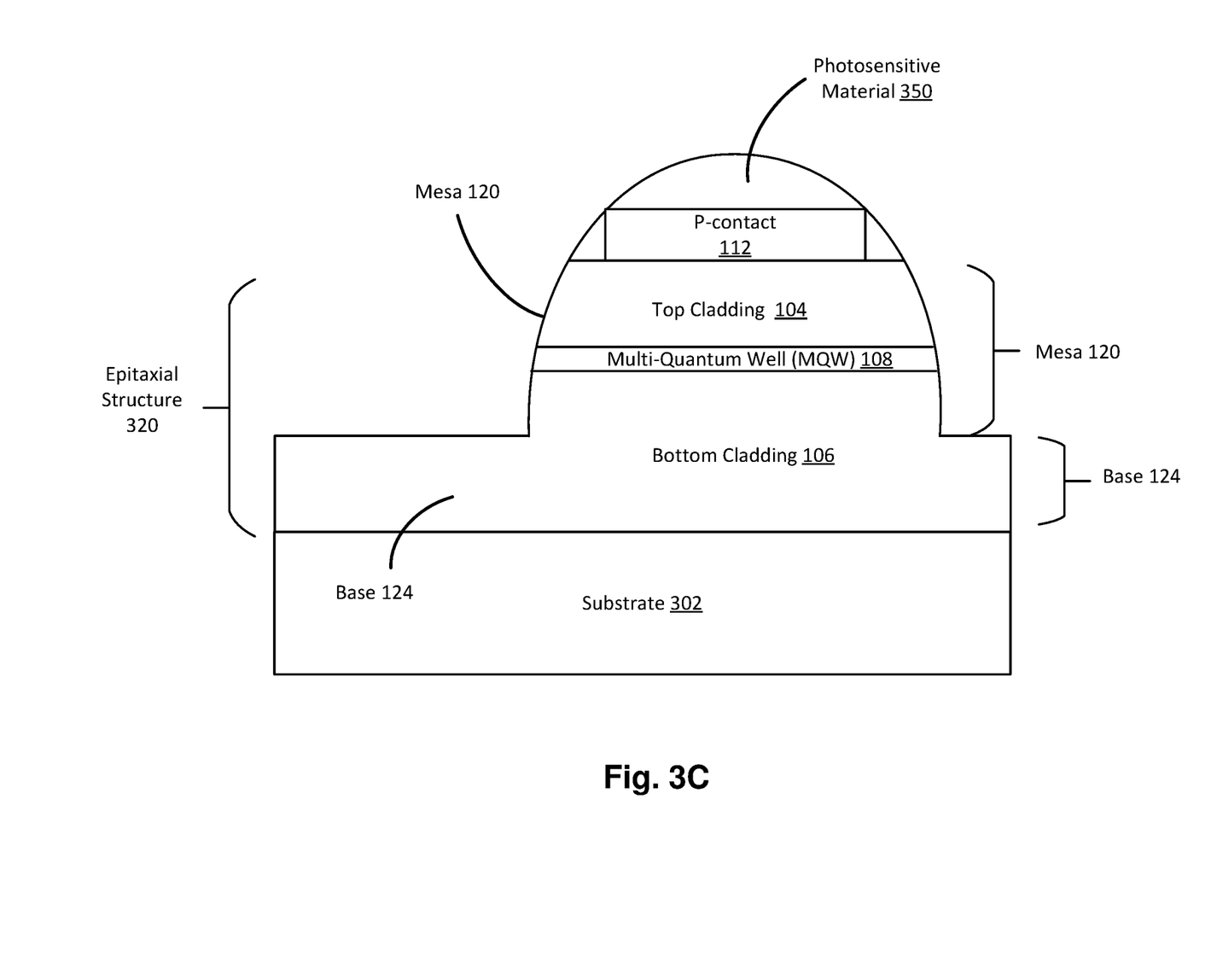

The epitaxial structure 320 is etched 220 to form a mesa 120 and a base 124. With reference to FIG. 3C, the mesa 120 and base 124 are formed in the epitaxial structure 320 using the photosensitive material 350 as a mask for the etching process. The photosensitive material 350 may be a sacrificial layer that is fully or at least partially removed in connection with the etching of the epitaxial structure 320 to form the mesa 120. The p-contact 116 may also serve as a hard mask for the etching.

In some embodiments, a dry etching processes, such as an inductively coupled plasma (ICP) etch, may be used to form the mesa 120 and the base 124 in the epitaxial structure 320. The ICP etch may be used to provide controllable isotropic or anisotropic etching by varying parameters to form the shape of the mesa 120 and the base 124, such as the parabolic, cylindrical, or conic shapes with truncated top. The ICP etch may include a combination of physical and chemical etching. The physical etching may provide an anisotropic, non-selective etch while the chemical etching may provide an isotropic etch that is selective to etch reactive materials (e.g., the epitaxial structure 320, but not the photosensitive material 350). By tweaking the ICP recipe, the etch process is controlled to etch sloped side walls for the mesa 120 that define the shape of the mesa 120. For regions of the epitaxial structure 320 to be formed into the base 124, which are not protected by the photosensitive material 350 and p-contact 112, the epitaxial structure 320 is etched from the top cladding 104, through the MQW 108, and through a portion of the bottom cladding 106. After the etching, the mesa 120 includes the top cladding 104 at the top of the mesa, the MQW 108, and a portion of the bottom cladding 106. The base 124 located below the mesa 120 includes another (e.g., un-etched) portion of the bottom cladding 106.

In some embodiments, the photosensitive material 350 is reflown into a shape, and the reflown resist shape is replicated to the epitaxial structure 320 to form the mesa 120 via an etching with a controlled selectivity. For example, the photosensitive material 350 may be formed into a parabolic shape to result in the mesa 120 having the parabolic shape with truncated top. Additional details regarding using an etching process to form a mesa in a semiconductor structure are discussed in U.S. Pat. No. 7,598,148, titled "Micro-leds," issued Oct. 6, 2009, which is incorporated by reference herein in its entirety.

Figure 3D:
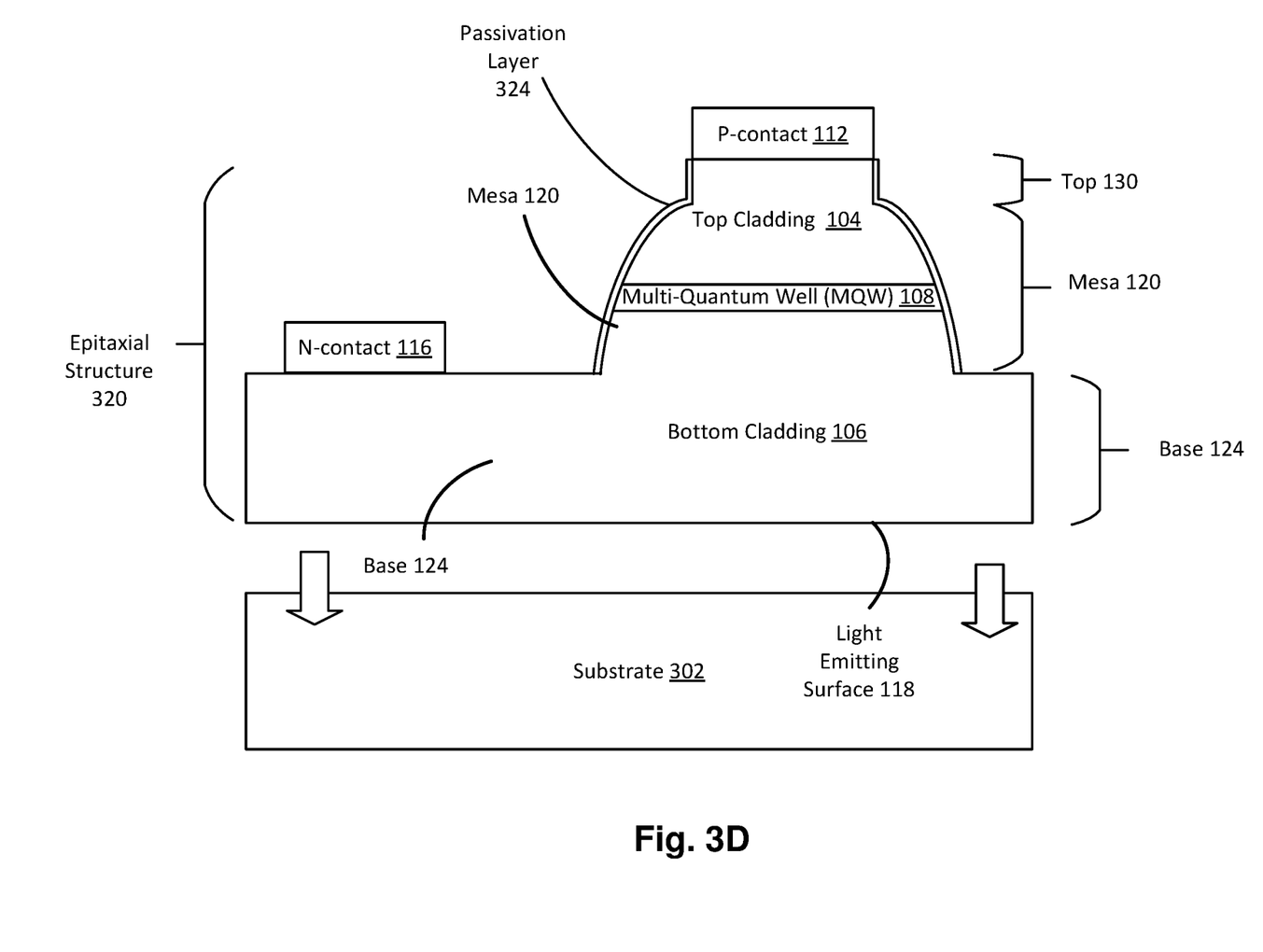

The epitaxial structure 320 is further etched 225 to form a top portion 130 on the mesa 120. With reference to FIG. 3D, the epitaxial structure 320 may be etched using the p-contact 112 as a hard mask to form the top portion 130 over the mesa 120. In some embodiments, the top portion 130 is formed using a separate etching from the etching of step 220 used to form the mesa 120. The etching to form the top portion 130 may also be an ICP etch, except that the ICP etch to form the top portion 130 may be more anisotropic. For example, the etching to form the top portion 130 may use an anisotropic physical etch, or by varying selectivity between the photosensitive material 350 and the material of the epitaxial structure 320 for the ICP etch. This results in etching away portions of the mesa 120 to form the top portion 130 above the mesa 120 and under the p-contact 112. In other embodiments, a single (e.g., ICP) etch may be performed to form the mesa 120 and the top portion 130. Here, the epitaxial structure 320 may be over etched after formation of the mesa 120 to from the top portion 130. The etching steps discussed herein are not limited to ICP etching, and other types of etching may be used to form the mesa 120 and the top portion 130 including dry etching, wet etching, or combinations of dry and wet etching.

A contact (e.g., n-contact 116) is formed 230 on the base 124. With reference to FIG. 3D, the n-contact 116 is formed on the base 124 of the bottom cladding 106 opposite the light emitting surface 118. The n-contact 116 and p-contact 112 form the electrical contacts used to drive the μLED 100. Furthermore, a passivation layer 324 may be formed on the exterior of the mesa 120 and the top portion 130. In some embodiments, a reflective material is formed on the formed on the exterior of the mesa 120 and the top portion 130 to improve light extraction efficiency.

The growth substrate 302 is separated 235 from the epitaxial structure 320 to expose a light emitting surface 118 of the epitaxial structure 320. In some embodiments, a laser lift-off process may be used to separate the substrate 302 from the epitaxial structure 320. For example, the bottom cladding 106 of the epitaxial structure 320 may be a gallium-based layer or other type of layer that absorbs laser light, and the growth substrate 302 may be transparent to the laser light (e.g., sapphire substrate for ultraviolet (UV) light). The laser may be applied to the bottom cladding 106 through the substrate 302 to form a gallium material between the bottom cladding 106 and the substrate 302. The laser light is absorbed over a thin thickness inducing a local melting of a portion of the bottom cladding 106 into gallium (Ga) metal and a gas. In an example where the bottom cladding 106 includes GaN, the portion of the bottom cladding 106 is separated into the gallium metal and nitrogen (N₂) gas. The gallium material is heated to debond the bottom cladding 106 and the substrate 302, and the substrate 302 is then separated from the bottom cladding 106. The separation of the substrate 302 and the epitaxial structure 320 is not limited to using a laser lift-off process, and other types of suitable processes may also be used such as wet etching. In some embodiments, if the growth substrate is transparent for the light emitted from the LED, then the growth substrate can remain attached to the epitaxial structure 320. For example, it is not necessary to separate a GaN epitaxial structure from a sapphire growth substrate because sapphire is transparent for the blue or green light emitted from the GaN epitaxial structure.

Although the process 200 is discussed for forming a single µLED 100, the process 200 may be used to form multiple (e.g., an array) of µLEDs on a single epitaxial structure. For example, multiple p-contacts 112 and photosensitive material 350 masks may be formed on the top cladding 104 of an epitaxial structure 320, and then the epitaxial structure 320 may be etched to form a mesa 120 and a top portion 130 under each p-contact 112. Multiple µLEDs 100 may share a common epitaxial structure 320, or the µLEDs 100 may be singulated into separate dies, such as by another ICP etching or a laser dicing.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method of manufacturing a light emitting diode (LED), comprising:
    forming an epitaxial structure including a light generation region;
    forming a contact on the epitaxial structure;
    depositing photosensitive material on the contact; and
    etching the epitaxial structure with the contact and the photosensitive material as masks to form a mesa having a truncated top and a top portion over the truncated top, wherein etching the epitaxial structure causes the mesa to have a parabolic shape and the light generation region to be positioned in the mesa.

2. The method of claim 1, wherein etching the epitaxial structure includes performing an inductively coupled plasma (ICP) etch.

3. The method of claim 1, wherein etching the epitaxial structure causes the light generation region to be positioned at a parabola focal point of the mesa.

4. The method of claim 1, wherein etching the epitaxial structure includes:
    performing a first etch using the photosensitive material as a first mask to form the mesa; and
    performing a second etch using the contact as a second mask to form the top portion on the mesa.

5. The method of claim 1, wherein forming the epitaxial structure includes forming an electron blocking layer (EBL) on the light generation region.

6. The method of claim 1, further comprising forming a reflective material along a side surface of the top portion.

7. The method of claim 1, further comprising forming a reflective material along a side surface of the mesa.

8. The method of claim 1, further comprising applying a reflow process to the photosensitive material to form a shape, and wherein the shape is transferred to the mesa by the etching of the epitaxial structure.

9. The method of claim 1, wherein the top portion includes a cylindrical structure.

10. The method of claim 1, wherein the top portion has a height of between 0.1 and 5 um.

11. The method of claim 1, wherein the light generation region includes one or more quantum wells.

12. The method of claim 1, wherein forming the epitaxial structure includes growing the epitaxial structure on a growth substrate.

13. The method of claim 12, further comprising, subsequent to etching the epitaxial structure, separating the epitaxial structure from the growth substrate to expose a light emitting surface of the LED.

14. The method of claim 1, wherein etching the epitaxial structure includes forming a base below the mesa.

15. The method of claim 14, further comprising forming another contact on the base.

16. The method of claim 1, wherein the contact includes a reflective material for light generated by the light generation region.

17. The method of claim 1, wherein the epitaxial structure includes a top cladding over the light generation region and a bottom cladding under the light generation region.

18. The method of claim 17, wherein the top cladding includes a contact layer and a top confinement layer and the bottom cladding includes a current spreading layer and a bottom confinement layer.

19. The method of claim 17, wherein the top cladding and bottom cladding include one of a gallium nitride (GaN)-based heterostructure or a gallium arsenide (GaAs)-based heterostructure.

* * * * *